US006600368B2

United States Patent
Kim

(10) Patent No.: US 6,600,368 B2
(45) Date of Patent: Jul. 29, 2003

(54) ADAPTIVE PREDISTORTION LINEARIZER

(75) Inventor: Wang Rae Kim, Anyang (KR)

(73) Assignee: LG Electronics Inc., Seoul (KR)

( * ) Notice: Subject to any disclaimer, the term of this patent is extended or adjusted under 35 U.S.C. 154(b) by 23 days.

(21) Appl. No.: 09/739,841

(22) Filed: Dec. 20, 2000

(65) Prior Publication Data

US 2001/0004223 A1 Jun. 21, 2001

(30) Foreign Application Priority Data

Dec. 20, 1999 (KR) .............................. 99-59321

(51) Int. Cl.⁷ .............................. H03F 1/30; G01R 19/00; H03G 3/20
(52) U.S. Cl. .............................. 330/149; 330/2; 330/136
(58) Field of Search .............................. 330/149, 2, 136

(56) References Cited

U.S. PATENT DOCUMENTS 5,049,832 A * 9/1991 Cavers ..................... 330/149
5,742,201 A * 4/1998 Eisenberg et al. ......... 330/136
6,211,733 B1 * 4/2001 Gentzler .................... 330/149
6,337,599 B2 * 1/2002 Lee .......................... 330/149

* cited by examiner

Primary Examiner—Patricia. T. Nguyen
(74) Attorney, Agent, or Firm—Fleshner & Kim, LLP

(57) ABSTRACT

A predistortion linearizer of a power amplifier capable of improving the nonlinearity of the power amplifier by compensating changes in the power amplifier's nonlinear characteristics according to the lapse of time or an external environment and easily implementing the reverse characteristics of the power amplifier's nonlinear characteristics is disclosed. The predistortion linearizer of the power amplifier as disclosed includes a control unit for controlling a gain and phase of an input signal so that they are the reverse of the power amplifier's nonlinear characteristics, and a unit for compensating changes in the power amplifier's distortion characteristics according to the lapse of time or an external environment, upon receipt of the output of the control unit.

22 Claims, 4 Drawing Sheets

ADAPTIVE PREDISTORTION LINEARIZER

BACKGROUND OF THE INVENTION

1. Field of the Invention

The present invention relates to a power amplifier, and more particularly, to an adaptive predistortion linearizer capable of appropriately compensating changes in power amplifier's nonlinear characteristics.

2. Background of the Related Art

A power amplifier is used to increase the power of an input signal. An ideal power amplifier only increases gain (size) without otherwise distorting an input signal. However, since a power amplifier generally includes active devices having nonlinear characteristics, the output of the power amplifier inevitably contains a distortion component.

Accordingly, a variety of techniques and algorithms for improving the power amplifier's nonlinear characteristics have been proposed. Examples of these include predistortion, polar envelope correction, bias compensation, feedforward, etc. Of these examples, the predistortion method has a simple structure and an excellent efficiency, as compared to the feedforward method, and unlike the polar envelope method, has no limitations on bandwidth. In addition, the predistortion method is widely used in mobile communication base stations and the like, as a linearization method is more adaptable than the bias compensation method.

FIG. 1 illustrates a related art predistortion-type linearizer, including a predistorter 1 and a power amplifier 2. The predistorter 1 includes a FET (field effect transistor) or a diode.

A gain (size) and phase of the power amplifier 2 changes according to an input signal. In other words, an amplitude and phase of the output signal is nonlinearly outputted according to the size of the input signal This is referred to as AM-AM and AM-PM distortion. Thus, the output of the power amplifier contains a distortion component in addition to the input signal, due to the AM-AM and AM-PM distortion. This is generally called Inter-Modulation Distortion (IMD). The IMD due to the AM-AM and AM-PM distortion can cause a spectral regrowth in a digital communication system, thereby causing degradation of the communication system.

Therefore, as illustrated in FIG. 1, the predistorter 1, having the inverse/reverse characteristics of the AM-AM and AM-PM characteristics, is connected to the front end of the power amplifier 2 to remove the AM-AM and AM-PM distortion of the power amplifier 2. That is, if the gain and phase characteristics of the power amplifier 2 based on the size of an input signal are the same as shown in FIG. 2B, then the predistorter's characteristics are made to have the same characteristics as shown in FIG. 2A. This results in an output of the power amplifier 2 shown in FIG. 2C, the IMD due to the AM-AM and AM-PM distortion.

As described above, the predistorter in the related art predistortion-type linearizer has various problems. For example, it generates the reverse characteristics of the nonlinear characteristics of the power amplifier by using the nonlinear characteristics of the FET or DIODE. However, this method requires much time and labor since it must be implemented so that the nonlinear characteristics of the FET or DIODE are exactly the reverse of the power amplifier's characteristics.

In addition, the power amplifier's nonlinear characteristics (AM-AM, AM-PM) typically change over time or due to external environment (temperature, bias). Hence, in order to maintain the linearity of the power amplifier, the predistorter's non-linear characteristics (AM-AM, AM-PM) must be changed according to changes in the power amplifier's nonlinear characteristics. However, the related art predistorter's non-linear characteristics cannot effectively respond to the changes in the power amplifier's nonlinear characteristics. Thus, the linearity of the entire power amplifier is reduced.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide an adaptive predistortion that substantially obviate problems caused by limitations and disadvantages in the related art.

Another object of the present invention is to provide an adaptive predistortion linearizer capable of compensating changes in power amplifier's nonlinear characteristics, whether based on the lapse of time, an external environment or otherwise.

Another object of the present invention is to provide an adaptive predistortion linearizer capable of implementing the reverse characteristics of power amplifier's nonlinear characteristics in a simple manner.

To achieve at least these objects, in whole or in part, there is provided an adaptive predistortion linearizer according to the present invention, which includes: a control unit for controlling a gain and phase of an input signal so that they are the reverse of the power amplifier's nonlinear characteristics; and a unit for compensating changes in the power amplifier's distortion characteristics according to the lapse of time or an external environment, upon receipt of the output of the control unit.

In addition, to achieve at least these objects in whole or in part, there is provided an adaptive predistortion linearizer, which includes a divider for dividing an input signal into first through third paths; a fast gain/phase adjuster for adjusting a gain and phase of the input signal divided into the first path; a slow gain/phase adjuster for adjusting a gain and phase of an output signal of the fast gain/phase adjuster; a power amplifier for amplifying an output signal of the slow gain/phase adjuster to output the same; a fast gain/phase controller for outputting a first control signal according to the envelope of the input signal divided into the second path; and a slow gain/phase controller for outputting a second control signal by comparing the input signal divided into the third path with the envelope of the output signal of the power amplifier.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Generally, power amplifier's nonlinear (AM-AM, AM-PM) characteristics slowly changes according to changes in external environment. Thus, the adaptive predistortion linearizer, according to a preferred embodiment of the present invention, changes predistorter's nonlinear characteristics according to changes in the power amplifier's non linear characteristics. This is preferably done by detecting the envelope of an input and output from the power amplifier. In addition, the preferred embodiment implements the reverse characteristics of the power amplifier's nonlinear characteristics by controlling the predistorter. This is preferably done by detecting the envelope of an input signal.

Figure 1:
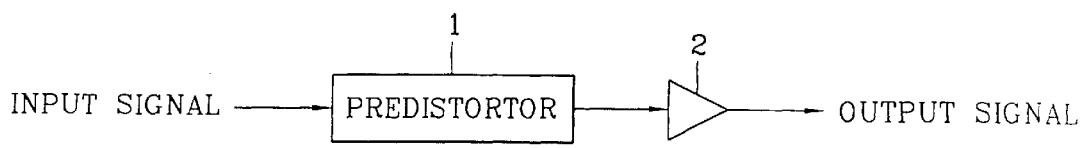
FIG. 1 is a block diagram of a related art predistortion-type linearizer.
Figure 2A:
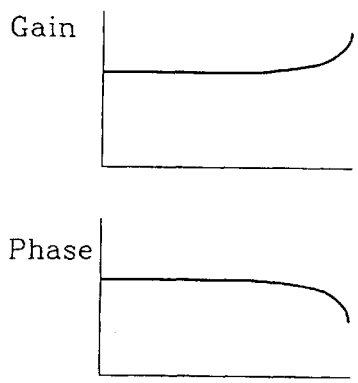
FIG. 2A is a diagram illustrating the characteristics of a predistorter.
Figure 2B:
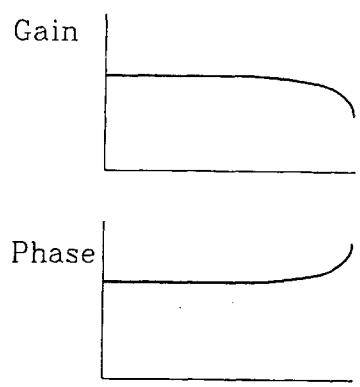
FIG. 2B is a graph illustrating the output characteristics of an input signal without the predistortion for the power amplifier of FIG. 1.
Figure 2C:
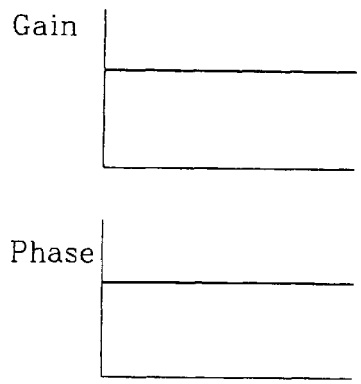
FIG. 2C is a graph illustrating a corrected output of the power amplifier of FIG. 1.
Figure 3:
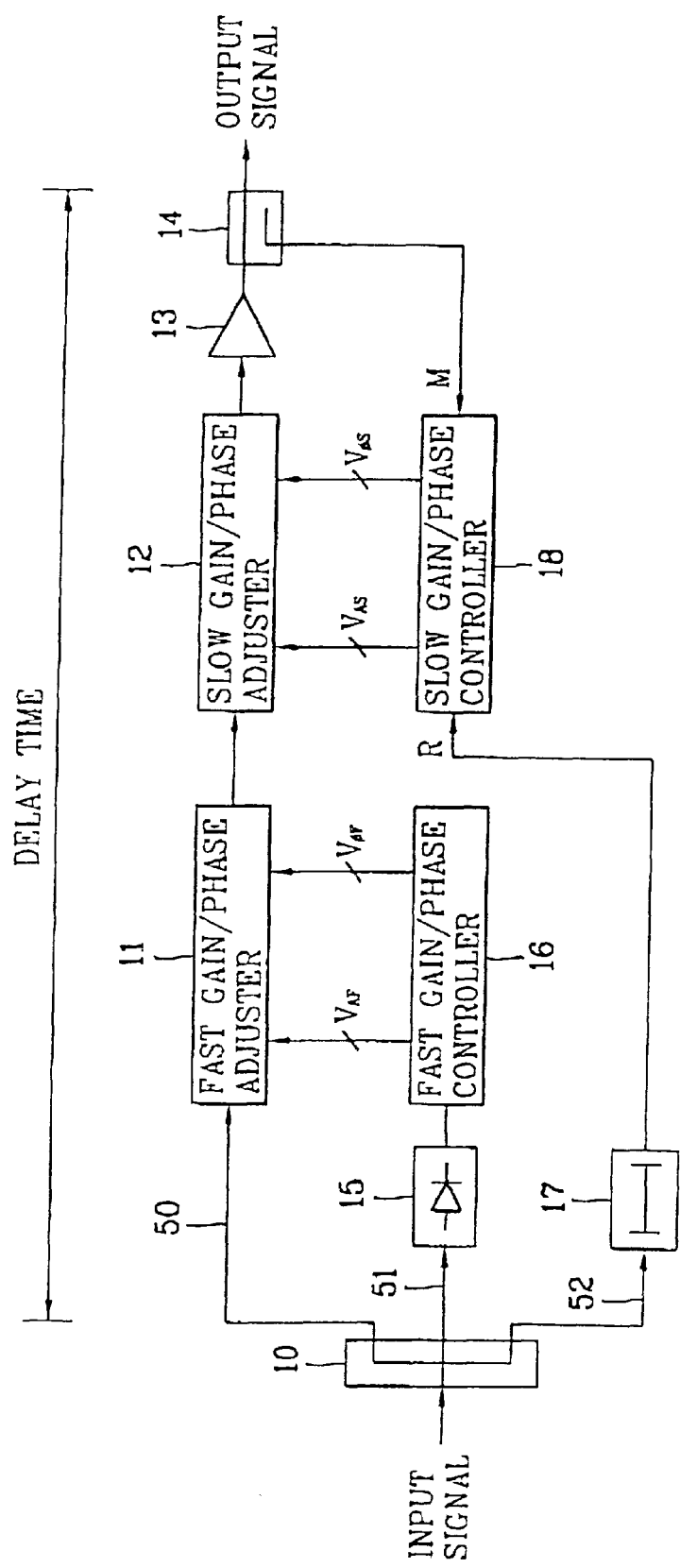
FIG. 3 is a block diagram of an adaptive predistortion linearizer according to a preferred embodiment of the present invention.

As illustrated in FIG. 3, a divider 10 serves to divide an input signal into first, second and third paths 50, 51, 52. In addition, a fast gain/phase adjuster 11, envelope detector 15, and fast gain/phase controller 16 are circuit blocks for implementing the inverse/reverse characteristics of the power amplifier's nonlinear characteristics.

A slow gain/phase adjuster 12 and a slow gain/phase controller 18 serve to compensate changes in the power amplifier's nonlinear characteristics according to the lapse of time or an external environment. A delay line 17 delays an input signal to the slow gain/phase controller 18 to be consistent with the input time of a feedback signal M, and a directional coupler 14 serves to sample an output signal of the power amplifier 13 to provide the feedback signal M.

The fast and slow gain/phase adjusters 11 and 12 are predistorters, which can be implemented as a vector modulator, or can be constructed by serially connecting a variable attenuator with a variable phase shifter. They receive control signals from the fast and slow gain/phase controllers 16, 18 respectively.

The operation of the thusly constructed adaptive predistortion linearizer according to the preferred embodiment will now be described with reference to the accompanying drawings.

As illustrated in FIG. 3, an input signal is divided into three paths by the divider 10. The first path 50 is a main path, the second path 51 is a path for implementing the reverse characteristics of the power amplifier's nonlinear characteristics, and the third path 52 is a path for compensating changes in the power amplifier's characteristics according to the lapse of time or the external environment.

Figure 4A:
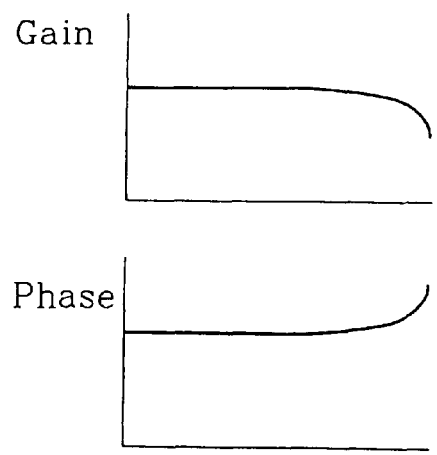
FIGS. 4A–4C are graphs illustrating the output characteristics of an input signal, fast gain/phase adjuster, and power amplifier in FIG. 3.
Figure 4B:
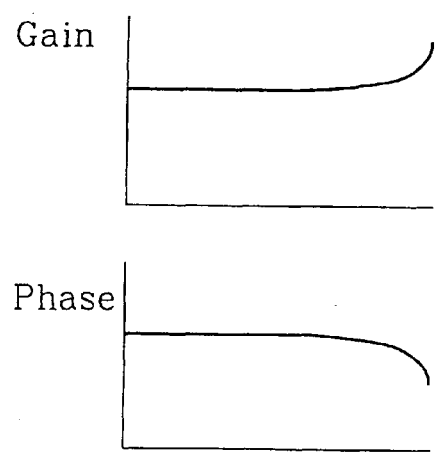
Figure 4C:
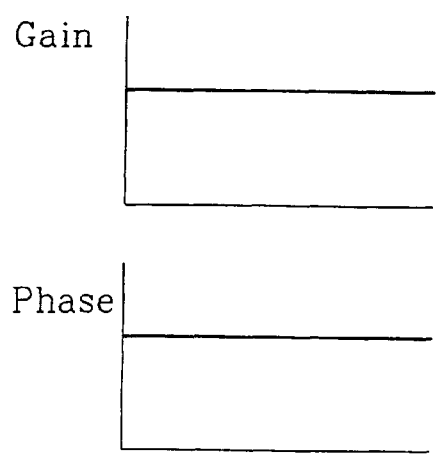

First, the envelope detector 15 on the second path 51 detects the envelope of the input signal. The fast gain/phase controller 16 controls the fast gain/phase adjuster 11 to be the reverse of the power amplifier's gain and phase characteristics according to the detected envelope. For example, if the amplifier's gain and phase characteristics based on the input signal are those shown in FIG. 4A, the fast gain/phase controller 16 controls a gain and phase so that the gain /phase characteristics of the fast gain/phase adjuster 11 become those shown in FIG. 4B. As a result, the characteristics of the output of the power amplifier 13 become those shown in FIG. 4C.

The delay line 17 in the third path controls a delay period so that a reference signal R and a feedback signal M are simultaneously inputted to the slow gain/phase controller 18. It does not matter how long the delay time is, because changes in the power amplifier's characteristics based on the lapse of time and the external environment (temperature, bias) occur slowly. The feedback signal M is an output signal sampled from the directional coupler 14 via the fast gain/ phase adjuster 11 and the power amplifier 13.

Therefore, the slow gain/phase controller 18 controls the slow gain/phase adjuster 12 to catch up with the changes in the power amplifier's characteristics based on the lapse of time or the external environment (temperature, bias), by comparing the envelope of the reference signal R with the envelope of feedback signal M.

Figure 5:
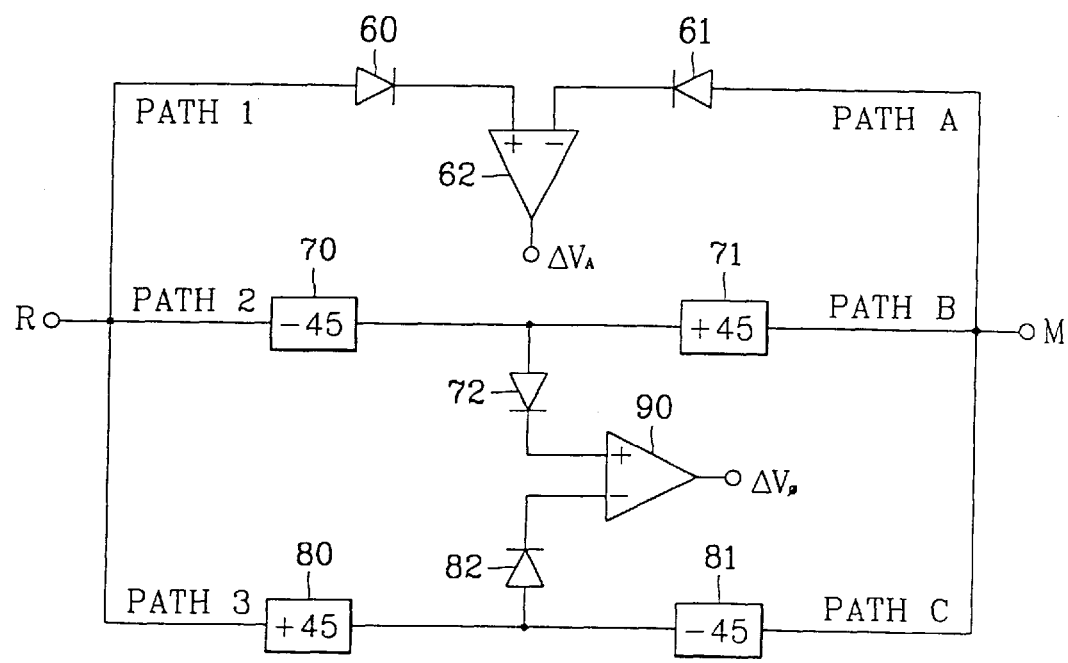
FIG. 5 is a block diagram illustrating the slow gain/phase controller of FIG. 3.

FIG. 5 illustrates the slow gain/phase controller 18 according to the preferred embodiment of the present invention. As illustrated in FIG. 5, the reference signal R and feedback signal M inputted to the slow gain/phase controller 18, and divided into three paths.

First, at path 1 and path A, envelope detectors 60 and 61 detect an envelope of the reference signal R and feedback signal M, respectively, and the two detected envelopes are compared by a comparator 62. If the envelopes of the two signals are the same, the output of the comparator becomes "0". On the contrary, if the envelopes of the two signals are different, the output of the comparator becomes $\Delta V_{AS}$. Hence, the gain and phase of the slow gain/phase adjuster 12 are controlled such that $\Delta V_{AS}$ becomes 0, and the gain of the entire power amplifier 13 is maintained constant. In other words, the changes in the power amplifier's AM-AM distortion characteristics based on the external environment are removed.

Next, the path for detecting a phase difference is achieved via path 2/path B and path 3/path C. For instance, supposing that two signals having the same gain and having a phase difference of θ between them, e.g., cos θt and cos ωτ+θ, are inputted respectively to path 2/path B and path 3/path C. The signals pass through phase shifters 70, 71, 80, and 81, envelope detectors 72 and 82. Phase shifters 70 and 80 shift the phase of the input signal R by −45 degrees and by +45 degrees, respectively, and phase shifters 71 and 81 shift the phase of the feedback signal R by +45 degrees and by −45 degrees, respectively. Thus signals are then inputted to comparator 90. The output of the comparator 90 can be expressed by Equation 1.

$$\Delta V_\theta = \sin \theta \qquad \text{Equation 1}$$

That is, a value corresponding to the phase difference between the two signals is outputted. Thus, if the gain and phase of the slow gain/phase adjuster 12 is controlled to be $\Delta V_{\theta S}$, the phase of the power amplifier 13 becomes constant. In other words, changes in the AM-AM distortion characteristic of the power amplifier 13 based on the lapse of time and the external environment at this time. The two diodes 60 and 61 used in path 1/path A and the two diodes 72 and 82 used in path 2/path B and path 3/path C preferably have the same characteristics.

As described above, the adaptive predistortion linearizer according to the preferred embodiment of the present invention has many advantages. For example, it can easily implement the reverse characteristics of the power amplifier's nonlinear characteristics by controlling the predistorter by detecting the envelope of the input signal.

In addition, the adaptive predistortion linearizer according to the preferred embodiments of the present invention results in a power amplifier which is more stable and of which the characteristics are less degraded, by detecting the envelope of the input and output of the power amplifier and changing the predistorter's nonlinear characteristics according to changes in the power amplifier's nonlinear characteristics.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An adaptive predistortion linearizer, comprising:
    first and second controllers configured to control a gain and phase of an input signal so that they are an inverse of nonlinear characteristics of a power amplifier; and
    first and second compensators coupled to receive an output of the respective first and second controllers and to compensate for changes in the power amplifier's distortion characteristics upon receipt of an output of the controller, wherein the first controller comprises a fast gain/phase controller configured to output a first control signal in response to an envelope detected by an envelope detector without receiving an output signal coupled from the power amplifier, and wherein the first compensator comprises a fast gain/phase adjuster coupled to receive the first control signal and adjust the gain and phase of the input signal according to the first control signal.

2. The linearizer of claim 1, wherein the first controller comprises
    the envelope detector, coupled to detect the envelope of the input signal, and wherein the input signal is provided to the envelope detector without passing through a delay.

3. The linearizer of claim 1, wherein the fast gain/phase adjuster comprises a vector modulator.

4. The linearizer of claim 1, wherein the fast gain/phase adjuster comprises a variable attenuator serially coupled to a variable phase shifter.

5. The linearizer of claim 1, wherein the second controller comprises:
    a delay line to delay the input signal for a prescribed period of time;
    a directional coupler configured to sample an output of the power amplifier; and
    a slow gain/phase controller coupled to compare the delayed input signal with an output signal of the directional coupler and output a second control signal; and wherein the second compensator comprises
    a slow gain/phase adjuster coupled to adjust a gain and phase of an output signal of the controller in response to a control signal and provide the same to the power amplifier.

6. The linearizer of claim 5, wherein the slow gain/phase adjuster comprises a vector modulator.

7. The linearizer of claim 5, wherein the slow gain/phase adjuster comprises a variable attenuator serially coupled to a variable phase shifter.

8. The linearizer of claim 5, wherein the slow gain/phase controller comprises:
    first and second envelope detectors coupled to receive the output signals of the directional coupler and the delay line, respectively, and to detect an envelope of each signal;
    a first comparator coupled to compare an output of the first envelope detector with an output of the second envelope detector and output a gain control signal;
    first and second phase shifters coupled to shift a phase of the input signal by a first and second prescribed phase, respectively;
    third and fourth phase shifters coupled to shift a phase of the output signal of the power amplifier by a third and fourth prescribed phase, respectively;
    a third envelope detector coupled to detect an envelope of an output signal of the first and third phase shifters;
    a fourth envelope detector coupled to detect an envelope of an output signal of the second and fourth phase shifters; and
    a second comparator coupled to compare an output of the third envelope detector with an output of the fourth envelope detector and output a phase control voltage.

9. The linearizer of claim 8, wherein the first and fourth prescribed phase shifts are −45 degrees and the second and third phase shift are +45 degrees.

10. The linearizer of claim 1, wherein the amplifier's distortion characteristics are caused by at least one of a lapse of time and external environment conditions.

11. An adaptive predistortion linearizer, comprising:
    a divider coupled to divide an input signal into first, second, and third paths;
    a fast gain/phase adjuster coupled to adjust a gain and phase of the input signal on the first path;
    a slow gain/phase adjuster coupled to adjust a gain and phase of an output signal of the fast gain/phase adjuster;
    a power amplifier coupled to amplify an output signal of the slow gain/phase adjuster;
    a fast gain/phase controller coupled to detect an envelope signal of the input signal on the second path and output a first control signal to control the fast gain/phase adjuster; and
    a slow gain/phase controller configured to compare an envelope signal of the input signal on the third path with an envelope of an output signal of the power amplifier and output a second control signal to control the slow gain/phase adjuster.

12. The linearizer of claim 11, wherein the fast gain/phase adjuster and the slow gain/phase adjuster each comprise a vector modulator.

13. The linearizer of claim 11, wherein the fast gain/phase adjuster and the slow gain/phase adjuster each comprise a variable attenuator serially coupled to a variable phase shifter.

14. The linearizer of claim 11, further comprising:
    an envelope detector to detect the envelope of the input signal on the second path, and output the same to the fast gain/phase controller;

a delay line to delay the input signal of the third path, and output the same to the slow gain/phase controller; and a directional coupler configured to sample the output of the power amplifier, and thereby outputting the same to the slow gain/phase controller.

15. The linearizer of claim 11, wherein the slow gain/phase controller comprises:

first and second envelope detectors configured to detect an envelope of the input signal and the output signal of the power amplifier, respectively;

a first comparator configured to compare an output of the first envelope detector with an output of the second envelope detector and output a gain control signal;

first and second phase shifters configured to shift a phase of the input signal by −45 degrees and +45 degrees, respectively;

third and fourth phase shifters configured to shift a phase of the output signal of the power amplifier by +45 degrees and −45 degrees, respectively;

a third envelope detector configured to detect an envelope of the output signal from the first and third phase shifters;

a fourth envelope detector configured to detect an envelope of an output signal from the second and fourth phase shifters; and a second comparator coupled to compare an output of the third envelope detector with an output of the fourth envelope detector and output a phase control voltage.

16. The linearizer of claim 11, wherein the input signal on the third path is delayed for a prescribed period of time before being provided to the slow gain/phase controller.

17. A method of controlling the linearity of a power amplifier, comprising:

controlling a gain and phase of an input signal to generate an intermediate signal having nonlinear characteristics that are an inverse of nonlinear characteristics of the power amplifier in accordance with a first compensation signal generated without considering an output signal of the power amplifier;

generating a second compensation signal based on a delayed input signal and an output signal of the power amplifier to compensate for changes in distortion characteristics of the power amplifier caused by time and environmental factors;

compensating the intermediate signal in accordance with the compensation signal to provide a compensated input signal;

amplifying the compensated input signal to generated the output signal of the power amplifier.

18. The method of claim 17, wherein each of the first and second compensation signals comprises a phase component and an amplitude component.

19. The method of claim 17, wherein the step of controlling the gain and phase of the input signal is performed by a vector modulator.

20. The method of claim 17, wherein the step of generating the compensation signal is performed by a vector modulator.

21. A method of controlling the linearity of a power amplifier, comprising:

detecting an envelope of an input signal;

generating a first control signal having a phase component and an amplitude component in response to the detected envelope without considering an output signal of the power amplifier;

adjusting a phase and amplitude of the input signal in accordance with the first control signal, and outputting a first intermediate signal;

detecting a first envelope of the delayed input signal phase shifted by a first phase and the output signal of the power amplifier phase shifted by a second phase;

detecting a second envelope of the delayed input signal phase shifted by the second phase and the output signal of the power amplifier phase shifted by the first phase;

comparing the first envelope with the second envelope to generate a phase compensation signal;

comparing an envelope of a delayed input signal with an envelope of an output signal of the power amplifier to generate a voltage compensation signal;

adjusting the phase and amplitude of the first intermediate signal in accordance with the phase compensation signal and the voltage compensation signal to generate a second intermediate signal; and amplifying the second intermediate signal to generate the output signal of the power amplifier.

22. The method of claim 21, wherein the first phase shift is −45 degrees and the second phase shift is +45 degrees.

* * * * *